US008343441B2

(12) United States Patent
van 't Oever et al.

(10) Patent No.: US 8,343,441 B2
(45) Date of Patent: Jan. 1, 2013

(54) METHOD FOR MANUFACTURING AND TESTING MICRO FLUIDIC CHIPS

(75) Inventors: Ronny van 't Oever, Deventer (NL); Marko Theodoor Blom, Enschede (NL)

(73) Assignee: Micronit Microfluidics B.V. (NL)

( * ) Notice: Subject to any disclaimer, the term of this patent is extended or adjusted under 35 U.S.C. 154(b) by 376 days.

(21) Appl. No.: 12/823,530

(22) Filed: Jun. 25, 2010

(65) Prior Publication Data
US 2011/0000283 A1 Jan. 6, 2011

(30) Foreign Application Priority Data

Jul. 3, 2009 (NL) .................................... 2003126

(51) Int. Cl.
*B01L 3/00* (2006.01)

(52) U.S. Cl. ........................................................ 422/502
(58) Field of Classification Search .................. 422/502, 422/503, 504, 507
See application file for complete search history.

(56) References Cited

U.S. PATENT DOCUMENTS

2003/0211014 A1* 11/2003 Jacquorie et al. ............. 422/102
2007/0141728 A1* 6/2007 Moreland et al. ............. 436/526

* cited by examiner

*Primary Examiner* — Hezron E Williams
*Assistant Examiner* — Nathaniel Kolb
(74) *Attorney, Agent, or Firm* — Bret E. Field; Bozicevic, Field & Francis LLP

(57) ABSTRACT

Aspects of the invention include methods and devices for manufacturing and testing microfluidic chips having at least one capillary for through-flow of a fluid.

10 Claims, 2 Drawing Sheets

METHOD FOR MANUFACTURING AND TESTING MICRO FLUIDIC CHIPS

CROSS-REFERENCE TO RELATED APPLICATIONS

Figure 1:
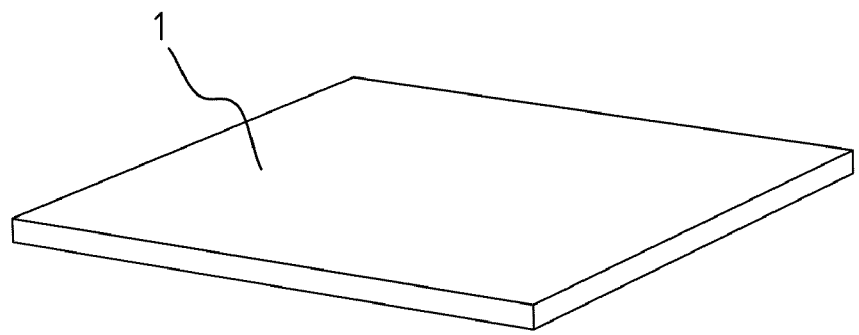

Pursuant to 35 U.S.C. §119, this application claims priority to the filing dates of: Netherlands Patent Application Serial No. 2003126 filed on Jul. 3, 2009; the disclosure of which application is herein incorporated by reference.

INTRODUCTION

1. Technical Field

The invention relates to a method for manufacturing and testing microfluidic chips having at least a capillary for through-flow of a fluid. The term "capillary" as used herein denotes a channel having a closed cross-section.

2. Background

Microfluidic chips are used for various applications, such as micro reactors, micro mixers and cross-capillary chips. Such microfluidic chips are for example manufactured by providing a glass sheet on which channels are etched. These channels are then closed by a second glass sheet which is bonded to the first glass sheet. This provides for a microfluidic chip comprising very small capillaries, which can be used in instruments, which perform analytic tests for example. It is furthermore possible to build such microfluidic chips from plastics, silicon or combinations thereof. Instead of etching a channel into the substrate, a channel may also be formed on the substrate by arranging two parts of an intermediate layer in a mutually spaced position. The channel is then defined by the space between these two parts of the intermediate layer. Alternatively, capillaries could be formed within the material from which the microfluidic chips are made. Connections in the microfluidic chips can be provided by holes in one of the sheets or capillaries running to the edges of the microfluidic chips.

It is furthermore possible to arrange further functional elements on the microfluidic chips. For instance electronics may be integrated onto the sheets by conventional semiconductor techniques like depositing a film and performing photolithography to remove parts of this film and build an electronic chip on top of the glass sheet.

Such microfluidic chips with integrated electronics could for example provide a flow sensor for measuring the flow in the capillary etched into the glass sheet.

After the microfluidic chips are built onto the glass sheet, the glass sheet is separated into individual microfluidic chips, e.g. by scribing and breaking, by laser cutting or by cutting with a saw, a technique known as 'dicing'.

After the glass sheet is separated into individual microfluidic chips, each and every microfluidic chip is tested to calibrate it. In case of a flow sensor, a flow with known characteristics is supplied to the capillary in the microfluidic chip and measured with the integrated electronics on top of the microfluidic chip. With these measurements it is possible to calibrate the microfluidic chip and the calibration data can be stored either outside of the microfluidic chip or inside the microelectronics.

The testing of the chips manufactured on a glass sheet takes a lot of time and results accordingly in higher costs. It is now an object of embodiments of the invention to reduce these disadvantages.

SUMMARY

This object is achieved by embodiments of the invention, e.g., as described below. Aspects of the invention relate to a method for manufacturing and testing microfluidic chips having at least one capillary for through-flow of a fluid. In some instances, the method comprises the following steps:

providing a starting material;
forming at least one shared capillary in the starting material;
arranging a plurality of functional elements in or over the shared capillary, thus forming a plurality of chips;
testing the chips by supplying a test fluid to the shared capillary; and
dividing the starting material into separate chips.

The invention further relates to a device for testing microfluidic chips having at least one capillary for through-flow of a fluid. This device comprises a material holder for holding a starting material in a fixed position during testing, and an inlet connector for connecting a shared capillary formed in the starting material to a test fluid supply.

DETAILED DESCRIPTION

As summarized above, aspects of the invention relate to a method for manufacturing and testing microfluidic chips having at least one capillary for through-flow of a fluid.

As the microfluidic chips are built on top of at least one common capillary and the chips are tested before separating them from the wafer, it is possible to have a fluid flow through the at least one common channel or capillary and test the chips, which are part of this common capillary. So, when testing it is possible to connect the at least one common capillary only once and then test a plurality of functional elements provided in or on top of this at least one common capillary. Only after the functional elements are tested, for example calibrated, the wafer is cut into separate parts.

It is furthermore preferred that the wafer is a glass sheet. In particular in the field of analysis it is desired to have a clear view of the fluid flowing through the at least one common capillary. It also enables tests of the fluid in the common capillary, which are based on light, for example diffraction of light.

Preferably, the capillary is provided by etching or sand blasting.

Alternatively, the wafer may be made of a plastics material and the capillary may be formed by hot embossing or injection moulding.

The capillary provided in the wafer could either be a straight capillary or a capillary having a repeating pattern with a pitch corresponding to the pitch of the chips.

In one embodiment of the method according to the invention the common capillary is formed by arranging a channel in or on the surface of the wafer and closing off this channel by arranging a cover layer thereon. This cover layer may also carry part of the functional elements.

Alternatively, the common channel may be closed off by the functional elements themselves, when they are arranged thereon.

The chips may be tested either electronically, hydraulically and/or mechanically.

Hydraulic testing may include detecting possible flow leaks and/or pressure losses while the test fluid is supplied to the common capillary. In this way a parallel functional test of the valves may be performed by applying a fluid pressure to the common capillary or capillaries. In this particular case evaluation of the test can be performed visually.

Electronic testing of the chips may be done by connecting the chips to electronic testing equipment and testing the chips while supplying a test fluid to the common capillary.

So with the method according to the invention it is possible to have a plurality of chips tested while the at least one common capillary is supplied with a test fluid. It is no longer necessary to reconnect the fluid supply to each and every separate chip.

Testing of the chips could be performed either in parallel, in series or concurrently. Testing is however always performed while supplying the test fluid to the common capillary.

The chips may be flow sensors, which can be formed on the wafer by photolithographic techniques. Alternatively, the flow sensors could be attached to the wafer by bonding techniques.

In yet another preferred embodiment according to the invention the wafer comprises a plurality of parallel common capillaries and the functional elements are provided in rows over the plurality of parallel common capillaries.

The invention further relates to a device for testing microfluidic chips having at least a capillary for through-flow of a fluid, said device comprising:
- a wafer holder for holding the wafer in a fixed position during testing; and
- an inlet connector for connecting the at least one common capillary to a test fluid supply.

In a first embodiment the testing device comprises means for detecting flow leaks and/or pressure losses.

In an alternative embodiment the testing device may be provided with:
- at least one electrical connector for electrically connecting at least one chip to be tested; and
- control means connected to the at least one electrical connector for testing the chip and controlling the fluid supply.

These and other advantages of the invention will be elucidated with the accompanying drawings.

FIGS. 1-5 show the different steps of an embodiment of the method according to the invention.

In FIG. 1 a wafer 1 is schematically shown. This wafer is preferably a glass sheet.

Figure 2:
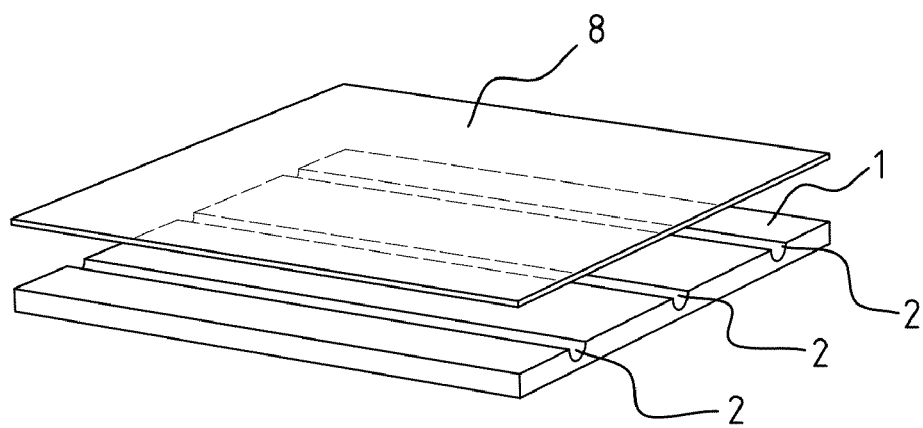

In FIG. 2 three separate parallel common channels 2 are provided in the wafer 1. These channels can be provided by for example etching or sand blasting. The channels are subsequently closed off by a second glass sheet 8, thus forming capillaries.

Figure 3:
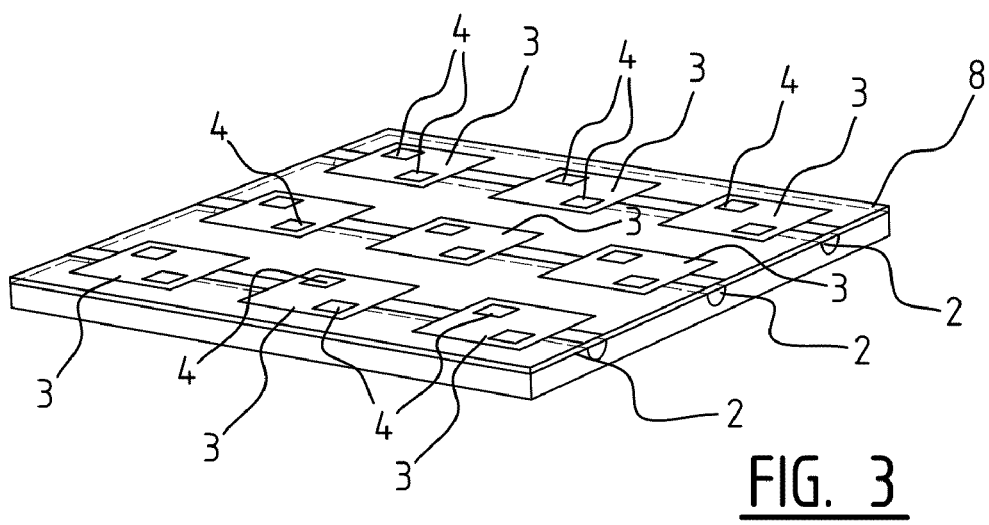

In FIG. 3 common semiconductor techniques are used to provide functional elements—in this embodiment electronic integrated circuits or chips 3—over the common capillaries 2.

In FIG. 3 each electronic chip 3 is provided with two contacts 4.

Figure 4:
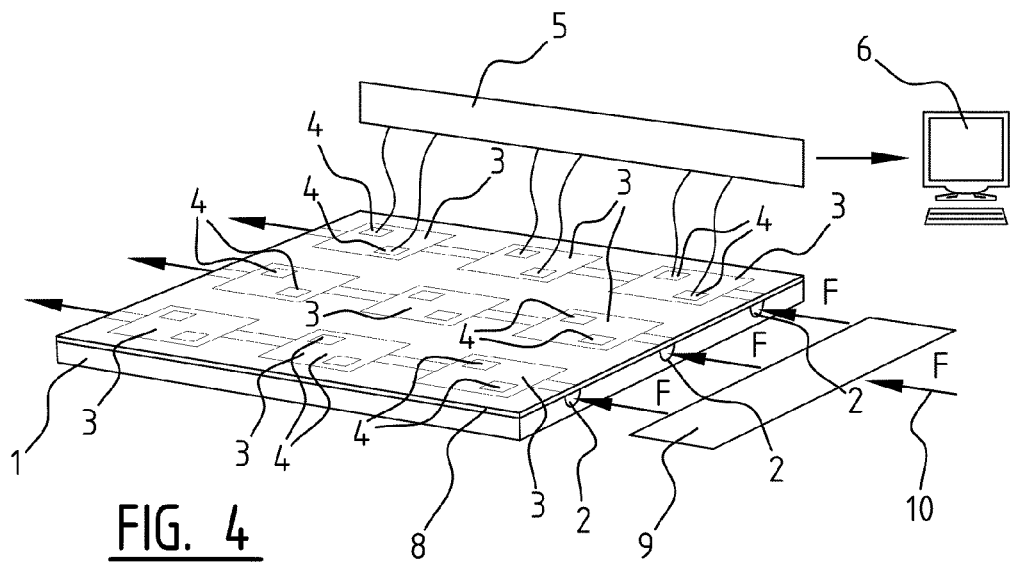

Before the wafer 1 is cut into nine separate microfluidic chips 7, the wafer 1 is tested. To achieve this each common capillary 2 is supplied with a fluid F. In FIG. 4 a special connector 9 is schematically shown, which connects the fluid supply 10 to the separate common capillaries 2.

Furthermore, the contacts 4 of each electronic circuit 3 are shown to be connected to a data bus 5, which is in turn connected to a testing device 6, like a personal computer.

As the test fluid F is supplied to the common capillaries 2, the microfluidic chips, in particular the electronic circuits 3 can be tested all at once or at least without having to reconnect the fluid supply 10.

Figure 5:
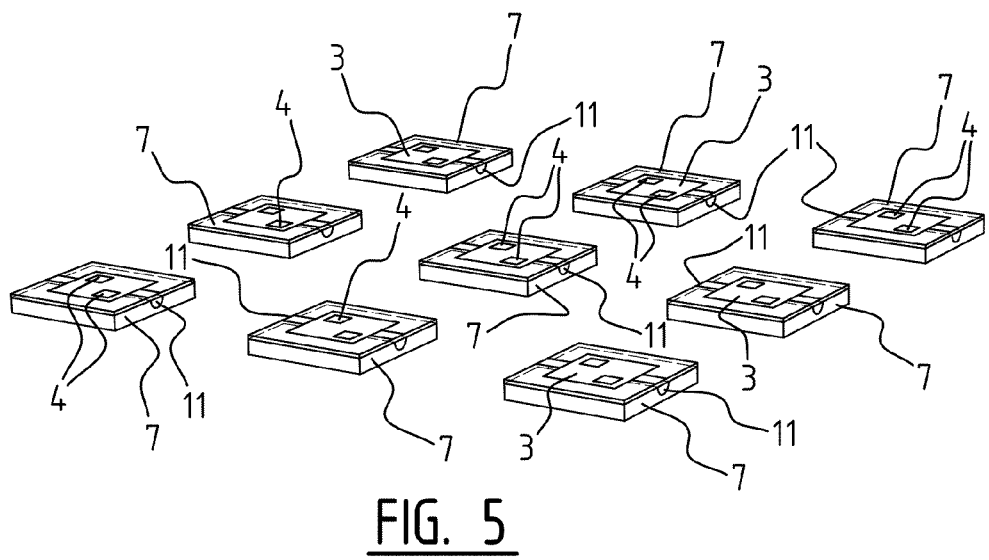

Finally, as shown in FIG. 5, the wafer 1 is separated into several pieces, which each constitute a microfluidic chip 7 having a separate capillary 11. These microfluidic chips 7 can be packaged directly without any further testing as this is already performed when the microfluidic chips 7 were part of the wafer 1.

Although the invention has been illustrated by way of an exemplary embodiment, it is not intended to be limited thereto. Many variations and modifications are conceivable. For instance, the wafer might be made of a plastics material, in which case the capillaries can be formed using entirely different techniques. It is also conceivable for the capillaries to be formed by closing off the channels by means of the functional elements, rather than by a second glass sheet. Moreover, other types of functional elements, e.g. microvalves could be arranged in the microfluidic chips and be collectively tested on the wafer, instead of electronic circuits.

Accordingly, it is readily apparent to those of ordinary skill in the art in light of the teachings of this invention that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual aspects described and illustrated herein has discrete components and features which may be readily separated from or combined with the features of any of the other several aspects without departing from the scope or spirit of the present invention. Any recited method can be carried out in the order of events recited or in any other order which is logically possible.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles and aspects of the invention as well as specific examples thereof, are intended to encompass both structural and functional equivalents thereof.

Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein. Rather, the scope and spirit of present invention is embodied by the appended claims.

The invention claimed is:

1. A Method for manufacturing and testing microfluidic chips having at least one capillary for through-flow of a fluid, the method comprising:
   providing a starting material;
   forming at least one shared capillary in the starting material;
   arranging a plurality of functional elements in or over the shared capillary, thus forming a plurality of chips;
   testing the chips by supplying a test fluid to the shared capillary; and
   dividing the starting material into separate chips.

2. The method according to claim 1, wherein the shared capillary is formed by arranging a channel on or in the starting material and closing off this channel by arranging a layer of cover material thereon.

3. The method according to claim 2, wherein the functional elements are arranged when the channel arranged on or in the starting material is closed off with forming of the shared capillary.

4. The method according to claim 1, wherein the starting material is a glass sheet.

5. The method according to claim 1, wherein the shared capillary is formed by etching or sand blasting.

6. The method according to claim 1, wherein the starting material comprises a plastic and the shared capillary is formed by hot embossing or injection moulding.

7. The method according to claim 1, wherein the shared capillary has a repeating pattern with a pitch corresponding to the pitch of the chips.

8. The method according to claim 1, wherein the chips are tested electronically, hydraulically or mechanically.

9. The method according to claim 1, wherein the chips are tested in parallel, in series or concurrently while the test fluid is supplied to the shared capillary.

10. The method according to claim 1, wherein the starting material comprises a plurality of parallel shared capillaries and the functional elements are arranged in rows in or over the parallel shared capillaries.

* * * * *